United States Patent [19]

Kimura et al.

[11] Patent Number: 4,753,838

[45] Date of Patent: Jun. 28, 1988

[54] POLISHING SHEET MATERIAL AND METHOD FOR ITS PRODUCTION

[76] Inventors: Tsuguji Kimura, 5-7-17 Asahi-Chou, Souka-City, Saitama Prefec. 340; Shinichi Watanabe, 4-4 Enkaiji, Touyo-City, Ehime Prefec. 799-13, both of Japan

[21] Appl. No.: 79,620

[22] Filed: Jul. 30, 1987

Related U.S. Application Data

[63] Continuation-in-part of Ser. No. 874,774, Jun. 16, 1986, abandoned.

[51] Int. Cl.⁴ .............................................. B32B 33/00
[52] U.S. Cl. ..................... 428/91; 156/153; 156/154; 156/246; 156/249; 156/289; 428/160; 428/317.1; 428/319.7; 428/409
[58] Field of Search ............... 156/153, 154, 246, 247, 156/249, 289; 428/85, 91, 160, 317.1, 319.7, 409

[56] References Cited

U.S. PATENT DOCUMENTS

| | | | |
|---|---|---|---|
| 2,896,304 | 7/1959 | Peroni | 428/91 X |
| 3,284,274 | 11/1966 | Hulslander et al. | 156/153 X |
| 3,524,791 | 8/1970 | Bethman et al. | 428/91 X |
| 3,577,507 | 5/1971 | Corbett | 428/85 X |
| 3,719,549 | 3/1973 | Mittman | 156/154 X |
| 3,876,491 | 4/1975 | Martel | 428/85 X |
| 3,914,492 | 10/1975 | Wisotzky et al. | 428/85 X |

*Primary Examiner*—Robert A. Dawson
*Attorney, Agent, or Firm*—Townsend & Townsend

[57] ABSTRACT

A process and product by process of making a polishing sheet material especially useful in the polishing of silicon wafer is disclosed. There is known a process of producing a poromeric suede-like polyurethane layer which comprises applying a solution of polyurethane on an impermeable synthetic resin film, subjecting the polyurethane layer to wet coagulation to form a honeycomb-like cellular structure of polyurethane on the synthetic resin film, removing the synthetic resin film from the cellular polyurethane layer, and abrading a thin surface skin of the cellular layer to form the poromeric suede-like polyurethane layer. In the present invention, a supporting layer made of a non-poromeric, soft synthetic resin sheet having good flatness is joined to a reverse side of the suede-like polyurethane layer to form a polishing sheet material.

7 Claims, 1 Drawing Sheet

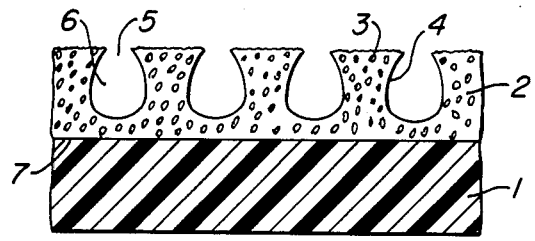
FIG._1.
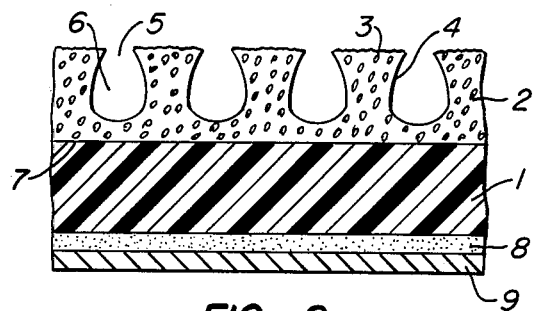
FIG._2.
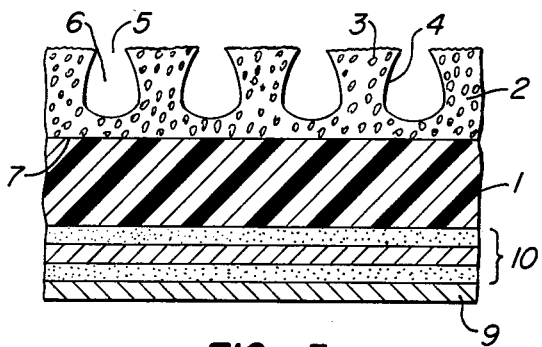
FIG._3.

POLISHING SHEET MATERIAL AND METHOD FOR ITS PRODUCTION

This application is a continuation-in-part of application Ser. No. 874,774, filed on June 16, 1986.

BACKGROUND OF THE INVENTION

The present invention relates in general to a polishing device and more particularly to a polishing sheet material for finely polishing and finishing the surface of a crystalline substrate, particularly a semiconductor silicon wafer, to obtain a highly polished mirror surface.

The polishing sheet material of the type described above has been generally made by the following two methods:

Japanese Patent Publication No. 40-20273 published Sept. 9, 1965 which corresponds to U.S. Pat. No. 3,284,274 issued Nov. 8, 1966, discloses one method in which a solution of polymeric material is applied directly over a supporting layer or substrate of a non-woven fabric and then subjected to wet coagulation to form a honeycomb-like cellular structure of the polymeric material on the supporting layer. Then, the thin surface skin of the exposed face of the thus formed cellular polymeric layer is abraded or cut away to open the internal cells and produce a poromeric suede-like layer.

The conventional method disclosed in the Japanese Patent Publication has a serious disadvantage in that irregularity in the thickness of the honeycomblike cellular polymeric layer is produced due to the irregularities of density and thickness in the non-woven fabric itself as well as irregularity in penetration of the solution of polymeric material applied thereon. Consequently, it has been difficult to successfully obtain a polishing sheet material with uniform distribution and flatness of the cellular polymeric layer when the surface skin of the cellular polymeric layer is abraded or cut away to form the suede-like layer.

In the other conventional method, a solution of polymeric material, e.g., polyurethane elastomer, is applied over an impermeable synthetic resin film and then subjected to wet coagulation to form a honeycomblike cellular structure of the polymeric layer on the synthetic resin film. The resin film is then stripped off or removed, and the thin surface skin of the exposed face of the cellular polymeric layer is abraded or cut away to form a poromeric suede-like layer. The poromeric layer is then adhered using a suitable adhesive to a supporting layer or substrate of a non-woven fabric to provide a polishing sheet material. The thus formed poromeric suede-like layer, which has more satisfactory flatness than that of the first-mentioned conventional method disclosed in the Japanese Patent Publication, however, has a disadvantage that a desired flatness is not obtained since the poromeric suede-like layer is adhered to the non-woven fabric of which irregularity of thickness is unavoidable.

When there is a lack of flatness in the polishing sheet material, the nap of the protruding surface portion is locally and deeply scraped, causing local damage or scratches generally called as "wormhole." Such wormholes generally shorten the life of the polishing sheet material.

Also, when the polishing sheet material is attached to a metal plate of a polishing machine, it has been necessary to apply a urethane or acrylic resin filler on the reverse side of the non-woven fabric substrate in order to prevent the penetration of polishing liquid slurry and to control the nap of the fiber of non-woven fabric, and then attach the polishing sheet material to the metal plate using a special, expensive adhesive tape with double surface. Otherwise, the nonwoven fabric would allow the polishing liquid slurry to penetrate rapidly to the adhering surface, causing the polishing sheet material to peel or rise from the adhering surface.

Furthermore, although a cooling device is generally installed in the polishing machine to remove the friction heat which is generated by polishing action, the non-woven fabric (which has a low heat conductivity and acts as a thermal insulator) can produce discoloration on the silicon wafer surface from the accumulated heat.

SUMMARY OF THE INVENTION

An object of the present invention is to provide an improved polishing sheet material which is not subject to the formation of wormhole on its surface during polishing operations.

Another object of the present invention is to provide a polishing sheet material which causes, when it is adhered to a metal plate of a polishing machine, no peeling off from the adhering surface without undercoating with a special filler.

A further object of the present invention is to provide a polishing sheet material which produces no discoloration on the surface of silicon wafer during the polishing of the same.

Another object of the present invention is to provide a method of producing the above-described improved polishing sheet material.

It has been discovered by the inventors herein that by using a non-poromeric, soft synthetic resin sheet with good flatness as a supporting layer, e.g., a polyvinyl chloride film, a satisfactory polishing sheet material product can be obtained which is flat, impermeable to polishing liquid slurry, and which possesses sufficient heat conductivity to allow for cooling by a cooling device installed in a polishing machine.

According to the present invention, a polishing sheet material is produced by the steps of applying a solution of polyurethane on an impermeable synthetic resin film, subjecting the polyurethane layer to wet coagulation to form a honeycomb-like cellular structure of polyurethane on the synthetic resin film, removing the synthetic resin film from the cellular polyurethane layer, abrading a thin surface skin of the cellular layer to form a poromeric suede-like polyurethane layer, and joining a supporting layer made of a non-poromeric, soft synthetic resin sheet having good flatness to a reverse side of the suede-like polyurethane layer. As the supporting layer, a non-poromeric, soft polyvinyl chloride sheet is preferably used.

BRIEF DESCRIPTION OF THE DRAWINGS

FIG. 1 is a sectional view of a polishing sheet material embodying the present invention;

FIG. 2 is a sectional view of a polishing sheet material according to another embodiment of the invention; and FIG. 3 is a sectional view of a polishing sheet material according to a further embodiment of the invention.

DESCRIPTION OF THE PREFERRED EMBODIMENT

In FIG. 1, a polishing sheet material produced by the method of the present invention has a non-poromeric, soft synthetic resin sheet made of polyvinyl chloride having a thickness in the range from about 0.2 to 1.0 mm, usually being about 0.5 mm, and a poromeric suedelike polyurethane layer 2 having a thickness in the range from about 0.2 to 1.0 mm, usually being about 0.45 mm, the latter being obtained by the secondmentioned conventional method. More specifically, the poromeric suede-like layer is formed in the following manner. On the surface of an impermeable synthetic resin film, e.g., polyester film (not shown in FIG. 1) is applied a dimethylformamide (DMF) solution of polyester polyurethane elastomer capable of producing a cellular structure. The applied layer of the solution of polyurethane in DMF is then subjected to wet coagulation, by bathing it in a liquid, e.g., water, which is a nonsolvent for polyurethane elastomer and is at least partially miscible with DMF, to thereby form a honeycomblike cellular structure of polyurethane on the polyester film. The cellular structure thus formed contains therein numerous microporous cells 3 and macroporous cells 4 each having a unique triangular shape in cross-section. The cellular polyurethane layer is then exfoliated or peeled off from the polyester film and washed with water and dried to form a separated cellular polyurethane layer having a thickness in the range from about 0.3 to 1.2 mm, usually being about 0.6 mm. Thereafter, a thin surface skin having a thickness in the range from about 0.1 to 0.2 mm, usually being about 0.15 mm thickness is removed from the cellular polyurethane layer by abrading, tearing or cutting to leave the poromeric suede-like layer 2 having the cells open at the exposed surface. Thus, the suede-like layer 2 contains its exposed surface macroporous cells 4 each having a narrow opening 5 with a deeply scooped recess 6 for holding therein a polishing liquid slurry.

The thus formed suede-like polyurethane layer 2 is joined at the reverse surface 7 to supporting layer 1, that is a non-poromeric, flexible synthetic resin sheet 1, e.g., soft polyvinyl chloride sheet. The layers 1 and 2 are joined by any suitable means, such as a solvent, heat, an adhesive agent, or a tacking agent. In the illustrated embodiment, the solvent DMF is applied to the reverse surface 7 of the poromeric polyurethane layer 2, onto which the soft polyvinyl chloride sheet 1 is attached with pressure.

The polishing sheet material may have a layer of adhesive agent 8 with a releasing paper 9 on the reverse side, i.e., exposed side of the soft synthetic resin sheet 1, as illustrated in FIG. 2, or alternatively an adhesive tape 10 with double-surface can be attached at the time of use, as illustrated in FIG. 3.

With polishing sheet material prepared according to the method of the present invention, sufficient flatness of both the soft synthetic resin sheet 1 and the suede-like polyurethane layer 2 can be achieved and, therefore, a desirable polishing sheet material with high flatness can be obtained. For instance, the thickness irregularity within 1 meter square has been determined according to Japanese Industrial Standard JIS K6505 that the prior art for polishing sheet material with a supporting layer of non-woven fabric and found to be 80 $\mu$m, whereas that of the polishing sheet material according to the present invention was 20 $\mu$m.

The improvement in flatness of the polishing sheet material has created an improved result with respect to the surface abrasion durability. According to the result of measuring the weight reduction by Taber abrasion according to JIS L1096 (weight 1 Kg., abrasing roll H-22), the polishing material having a supporting layer of non-woven fabric showed a weight reduction of 220 mg/1000 strokes, whereas the polishing sheet material according to the present invention showed 80 mg/1000 strokes.

Furthermore, it was found that the wormholes were substantially eliminated in the polishing sheet material of the present invention. A comparative test with respect to the final finishing treatment of silicon wafer was run by repeating the polishing for 10 minutes per cycle until a haze is developed. The result revealed 45 cycles for polishing using the polishing sheet material according to the present invention, which is about three times of that using the conventional product. Thus, the polishing sheet material of the present invention has a greatly prolonged service life.

In the polishing sheet according to the present invention, the supporting layer of the non-poromeric soft synthetic resin sheet has a higher heat conductivity relative to that of the conventional non-woven fabric and, therefore, a heat conductivity of the final product of polishing sheet material according to the present invention is high as $3.07 \times 10^{-4}$ cal/cm sec. $°$ C., whereas that of the conventional product is $1.60 \times 10^{-4}$ cal/cm.sec.$°$ C. The temperature of the surface of the polishing sheet material was measured by an infrared thermometer during polishing, and the conventional product revealed 28°–30° C., whereas the polishing sheet material according to the present invention revealed 26°–27° C., which is certainly lower by 2°–3° C., and the discoloration of the wafer surface due to the poor cooling was resolved completely.

Furthermore, since the soft synthetic resin sheet is impermeable to the polishing liquid slurry and does not allow the slurry to penetrate therethrough, the use of filler for undercoating is totally unnecessary. Besides, at the time of using the polishing sheet material of the present invention, an ordinary, commercially available adhesive tape with double surface can be used and, if necessary, a suitable adhesive agent can be directly applied to the reverse side of the soft synthetic resin sheet instead of the adhesive tape with double surface, without any trouble of peeling off or separation from the adhering surface of the polishing machine.

Although the foregoing invention has been described in some detail by way of illustration and example for purposes of clarity of understanding, it will be obvious that certain changes and modifications may be practiced within the scope of the appended claims.

What is claimed is:

1. A process of producing a polishing sheet material comprising the steps of:
    applying a solution of polyurethane on an impermeable synthetic resin film;
    subjecting the polyurethane layer to wet coagulation to form a honeycomb-like cellular structure of polyurethane on the synthetic resin film;
    removing the synthetic resin film from the cellular polyurethane layer;
    abrading a thin surface skin of the cellular layer to form a poromeric suede-like polyurethane layer; and
    joining a supporting layer made of a nonporomeric, soft synthetic resin sheet having good flatness to a reverse side of the suede-like polyurethane layer.

2. The process according to claim 1, wherein said non-poromeric, soft synthetic resin sheet comprises a sheet of soft polyvinyl chloride.

3. The process according to claim 1, which process further including the step of applying an adhesive to the exposed side of the soft synthetic resin sheet.

4. The process according to claim 3, which process further including the step of applying a release paper over said adhesive coating.

5. A polishing sheet material produced by the process according to claim 1.

6. A polishing sheet material produced by the process according to claim 3.

7. A polishing sheet material produced by the process according to claim 4.

* * * * *